United States Patent [19]
Pfeiffer et al.

[11] Patent Number: 5,466,904
[45] Date of Patent: Nov. 14, 1995

[54] ELECTRON BEAM LITHOGRAPHY SYSTEM

[75] Inventors: Hans C. Pfeiffer; Werner Stickel, both of Ridgefield, Conn.

[73] Assignee: International Business Machines Corporation, Armonk, N.Y.

[21] Appl. No.: 173,305

[22] Filed: Dec. 23, 1993

[51] Int. Cl.$^6$ .................. B23K 15/08; H01J 37/147; H01J 37/305
[52] U.S. Cl. .................. 219/121.25; 219/121.28; 250/396 ML; 250/492.2; 250/492.3
[58] Field of Search .................. 219/121.25, 121.26, 219/121.27, 121.28, 121.29, 121.3; 250/396 R, 397, 398, 396 ML, 492.2, 492.22, 492.3; 430/5, 296

[56] References Cited

U.S. PATENT DOCUMENTS

| | | | |
|---|---|---|---|
| 3,876,883 | 4/1975 | Broers et al. | 250/398 |
| 4,000,440 | 12/1976 | Hall et al. | 250/397 |
| 4,140,913 | 2/1979 | Anger et al. | |
| 4,198,569 | 4/1980 | Takayama | 250/492.2 |
| 4,243,866 | 1/1981 | Pfeiffer et al. | |
| 4,376,249 | 3/1983 | Pfeiffer et al. | 250/396 ML |
| 4,544,846 | 10/1985 | Langner et al. | 250/396 ML |
| 4,577,111 | 3/1986 | Saitou et al. | 250/492.2 |
| 5,036,209 | 7/1991 | Kataoka et al. | 250/492.2 |
| 5,084,622 | 1/1992 | Rose | 250/396 R |
| 5,105,089 | 4/1992 | Yamada | 250/492.2 |
| 5,136,167 | 8/1992 | Langner et al. | 250/396 R |
| 5,260,151 | 11/1993 | Berger et al. | 430/5 |
| 5,285,074 | 2/1994 | Haire et al. | 250/396 R |
| 5,316,879 | 5/1994 | Berger et al. | 430/5 |
| 5,364,718 | 11/1994 | Oae et al. | 430/5 |

OTHER PUBLICATIONS

Bohlen et al., "High Throughput Submicron Lithogra;hy with Electron Beam Proximity Printing", Solid State Technology, Sep. 1984, pp. 210–217.

Berger et al., "New approach to projection–electron lithography with demonstrated 0.1 μm linewidth", Appl. Phys. Lett. 57(2), 9 Jul. 1990, pp. 153–155.

Liddle et al., "Mask fabrication for projection electron–beam lithography incorporating the SCALPEL technique", J. Vac. Sci. Technol.B, 9 (6), Nov./Dec. 1991, pp. 3000–3004.

Berger et al., "Projection electron–beam lithography: A new approach", J. Vac. Sci. Technol.B, vol. 9, No. 6, Nov./Dec. 1991, pp.2996–2999.

Primary Examiner—Teresa J. Walberg
Assistant Examiner—Gregory L. Mills

[57] ABSTRACT

An electron beam system for direct writing applications combining the parallel throughput of a projection system and the stitching capability of a probe-forming system employs an electron gun to illuminate an initial aperture uniformly, a first set of controllable deflectors to scan the beam over the reticle parallel to the system axis, impressing the pattern of a subfield of the reticle in each exposure, in which a first variable axis lens focuses an image of the initial aperture on the reticle, a second variable axis lens collimates the patterned beam, a second set of controllable deflectors to bring the beam back to an appropriate position above the wafer, and a third variable axis lens to focus an image of the reticle subfield on the wafer, together with correction elements to apply aberration corrections that may vary with each subfield, thereby providing high throughput from the use of parallel processing of the order of $10^7$ pixels per subfield with the low aberration feature of the variable axis lens and the ability to tailor location-dependent corrections that are associated with gaussian systems that stitch the image pixel by pixel.

23 Claims, 5 Drawing Sheets

ELECTRON BEAM LITHOGRAPHY SYSTEM

RELATED APPLICATIONS

Copending applications Ser. Nos. 08/173,315 and 08/173,304 are incorporated herein by reference.

TECHNICAL FIELD

The field of the invention is that of direct-write electron beam systems for forming patterns on an integrated circuit wafer.

BACKGROUND ART

The classic e-beam system is a "probe-forming" system in which a narrow beam that is the image of the electron source and has a gaussian distribution is scanned over the wafer or other target by an amount equal to a "pixel" at a time, the pixel being defined as the full width at half height of the intensity distribution. Such "Gaussian" systems have the highest spatial resolution, but lowest throughput of all probe forming systems due to the serial exposure of patterns one pixel at a time. They have, however, the advantage that corrections can be applied dynamically and pixel by pixel to compensate for aberrations of the electron lenses and deflection units in the system.

An increase in throughput is effected by producing a larger spot on the wafer, adjustable in size, so that it is equal to the linewidth of the circuit. Those more efficient, i.e. higher throughput systems use a shaped spot on the wafer by generating an image of an aperture or other object illuminated by the source, not of the source itself. The image is electronically variable in size, adjustable to compose a pattern feature with serial exposures projecting up to several hundred pixels in parallel. An example is disclosed in U.S. Pat. No. 4,243,866.

The highest throughput is obtained with a projection system that projects all pixels in parallel. The classic e-beam projection system is modelled on optical projection systems. In the foreseeable future, chips may have a size of approximately 17 mm×35 mm, so that at a typical 4:1 demagnification ratio, the reticle will have a size of 70 mm×140 mm. Current technology is unable to produce an electron lens that will cover that size reticle with an acceptable fidelity at a nominal device groundrule corresponding to 0.25 μm critical dimension.

Throughput is essential if e-beam systems are to compete with light optical and X-ray systems. Therefore, mask projection would be the technique of choice for wafer exposure. A key requirement for high throughput is, of course, a highly intense beam. High power means great heat load on the reticle, which would lead to intolerable distortion of the reticle. An alternative approach to minimize thermal distortion of the reticle of a projection system is that of using a scattering reticle, as described in S. D. Berger & J. M. Gibson, APPL. PHYS. LETTERS 57 (2) (1990) 153), instead of an absorbing reticle. A scattering reticle requires an aperture above the wafer that preferentially absorbs scattered radiation having a greater scattering angle, thus translating scattering contrast into intensity contrast on the wafer.

A fundamental disadvantage of full field projection systems as compared with probe forming systems is the inability to dynamically correct for any aberrations (image blur, distortion) within a chip or exposure field, due to imperfections of the reticle, the e-beam system and/or the wafer.

Consequently, the art has long sought an e-beam system that would offer an acceptable tradeoff between accuracy and throughput.

SUMMARY OF THE INVENTION

The invention relates to an electron beam system for direct writing applications that combines the parallel pixel throughput of a projection system with the stitching capability of a probe-forming system by employing an electron gun to illuminate an initial aperture uniformly, a condenser lens to generate an intermediate image of the aperture, a first set of controllable deflectors to scan the beam over the reticle parallel to the system axis, in which a first variable axis lens having a magnetic field axis or "optical" axis coincident with the beam to form an image of the initial aperture at the reticle, thereby illuminating a sub-section or "subfield" of the reticle, a second variable axis lens to collimate the patterned beam, a second set of controllable deflectors to bring the beam back to an appropriate position above the wafer, and a third variable axis lens to form an image of the reticle subfield on the wafer, together with correction elements to apply aberration corrections that may vary with each subfield. The system thus provides high throughput from the use of parallel processing of the order of $10^8$ pixels (a pixel being about 0.1 μm on a side) per subfield and exploits the low aberration feature of the variable axis lens and the ability to apply location-dependent corrections that are associated with probe-forming systems that stitch the image pixel by pixel.

A feature of the invention is the ability to make dynamic corrections on each subfield to compensate for a variety of errors.

BEST MODE OF CARRYING OUT THE INVENTION

Figure 1:
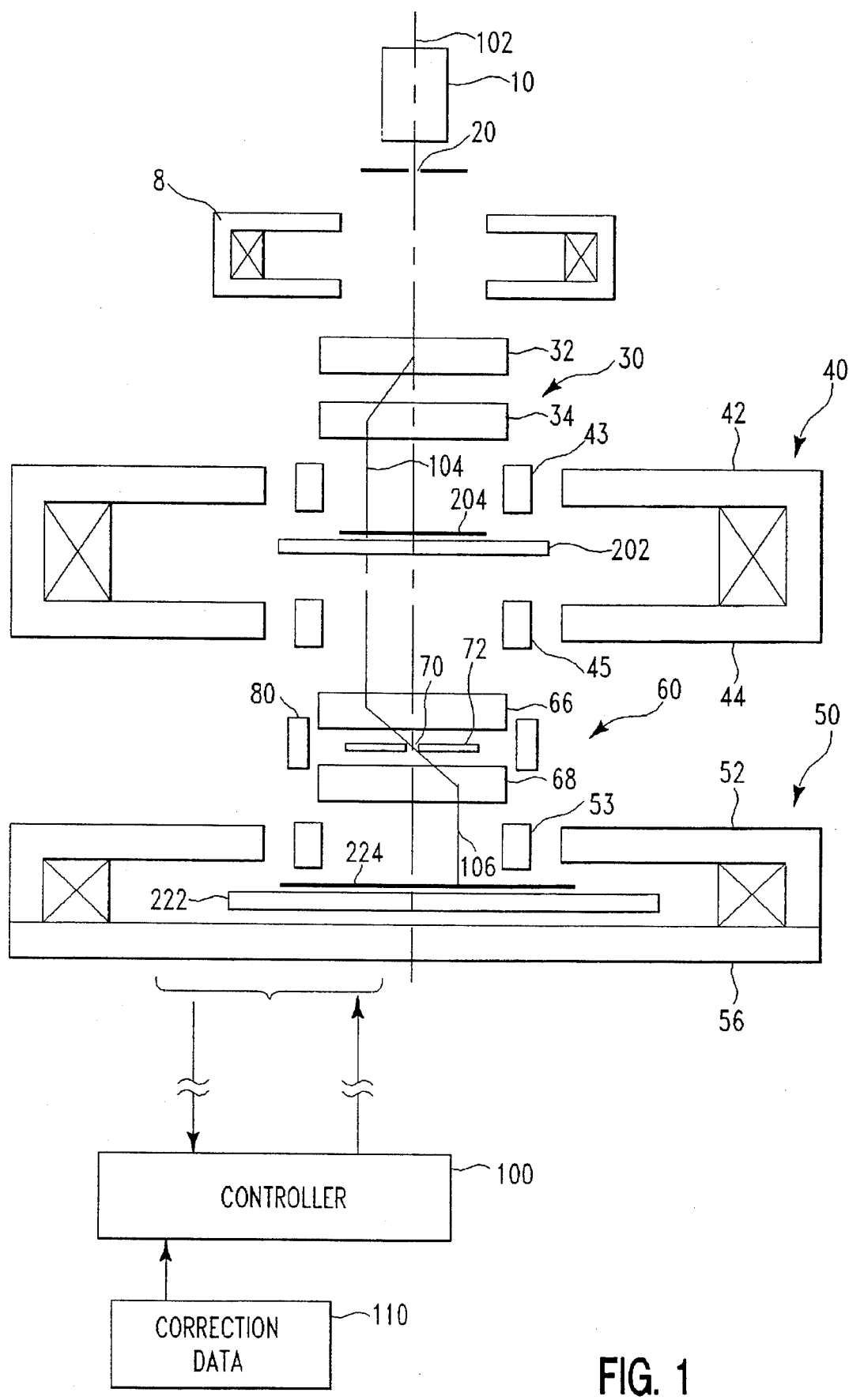
FIG. 1 illustrates in partially pictorial, partially schematic style, an embodiment of the invention.

Referring now to FIG. 1, there is shown in partially pictorial, partially schematic form, a first embodiment of the invention. At the top of the drawing, electron gun source 10 emits a diverging beam of electrons at a nominal energy of 100 KeV downwardly in the Z direction along system axis 102 through illuminating aperture 20, having a nominal dimension of 1 mm square in this example. The aperture size is chosen so that the electron distribution across this aperture is uniform within limits such that the intensity variation across the subfield on the wafer is acceptable. Typically, the uniformity limit is about 2% for e-beam systems. After passing through aperture 20, the beam is collimated (rendered parallel) by a conventional magnetic lens 8 acting as a condenser.

In order to accommodate the system demand for a very large field, the beam will be scanned in steps sequentially across the surface of reticle 204. The beam is deflected by conventional deflection means 32 and 34 which have the capability to deflect the beam orthogonally to the Z-axis in the X direction (left and right in the drawing) and/or in the Y direction (in and out of the plane of the paper). The beam extends downward along second axis 104, (for convenience, the beam axis at the nth subfield of the reticle will be referred to as the "reticle axis"), through a first variable axis lens denoted generally by the numeral 40 and having upper and lower pole pieces 42 and 44. Axis shifting yokes 43 and 45 (referred to generally as axis-shifting means) superimpose their fields over the lens fields generated between the pole pieces 42 and 44 so that the combined fields are azimuthally symmetric about axis 104 in a region larger than the beam, as is taught in U.S. Pat. No. 4,376,249. With this arrangement, off-axis aberrations introduced by the lens are substantially reduced, thereby permitting the use of a large scan field that may exceed 10 mm. Lenses of this type are referred to as variable axis lenses (VAL), since the optical axis of the lens is controllably shifted. The use of variable axis lenses provides high resolution electronic scanning of the reticle and wafer areas, which is complemented by mechanical scanning of the reticle and wafer as required to cover the entire chip real estate.

Beam 104 is focused onto reticle 204 by the upper part of lens 40, thereby creating an image of aperture 20 on the reticle coincident in size with a reticle subfield. Beam 104 strikes the nth subfield of the reticle 204 and passes parallel to the Z axis through the bore of pole piece 44. As it passes through the reticle, the beam is patterned with the information contained in the subfield. In the case of a conventional absorbing reticle, the beam will be essentially absorbed in thick opaque areas and pass undisturbed through open areas. Ring-shaped ("doughnut") patterns are sequentially exposed in super-position of complementary reticles to compose the desired features as described in H. Bohlen et al., Solid State Technology, September (1984) 210.

The lower portion of lens 40 again collimates the beam in this example and, together with deflector 66, directs the beam to contrast aperture 70 that performs several functions as described below. Preferably the beam is collimated in the space between lens 40 and lens 50, in order to reduce interactions between the electrons. Collimation is not required and the term "operating on" the beam will be used to cover collimating, focusing and defocusing. The lower part of lens 40 in conjunction with the preceding lenses including the upper portion of lens 40 focuses an image of source 10 on aperture 70 as well as collimating the image of the reticle. Those skilled in the art will readily understand the constraints or element position and focal length imposed by this requirement.

It is an advantageous feature of the invention that the image of a subfield on the wafer may be translated from the position where a full-chip projection system would place it. Thus, the subfields of the reticle can be projected by the system onto the wafer essentially independently of each other. Consequently, the requirements to be placed on the reticle regarding accuracy and stability can be drastically reduced, as the system can provide small corrections for the position of each subfield before and even during exposure. Furthermore, the capability of applying corrections on a subfield basis (a key advantage of probe-forming systems) eliminates the need for the reticle pattern to be contiguous over the entire chip area. Consequently, a stronger reticle can be used in which the subfields are physically separated and reinforcing struts are used to support the reticle and to resist the distorting effects of the heat absorbed by the reticle such as that illustrated in S. D. Berger et al., J. Vac. Sci. & Technol. B 9 (6)(1991) 2996; or in J. A. Liddle et al., Ibid., P. 3000). The subfields on the wafer are adjusted in position in the X-Y plane so that they are contiguous, using the stitching capability of the system.

Deflectors 66 and 68 perform a translation inverse to that done above reticle 204 to bring beam 104 back to system axis 102 at aperture 70 and then to bend the beam to final beam 106 (for convenience, the beam axis at the nth subfield image on the wafer will be referred to as the "wafer axis"), travelling parallel to axis 102 and on the opposite side from beam 104. The point at which the beam crosses axis 102 will be referred to as the pivot point because the beam pivots through that point as it images various subfields. Variable axis immersion lens (VAIL) 50 together with the lower half of variable axis lens 40 focuses beam 106 on to wafer 224, generating a demagnified image on the wafer of the pattern contained in the reticle subfield. Lens 50 is a particular form of VAIL in which a magnetically permeable plate 56 below wafer 224 provides a return path for the magnetic fields that focus the beam on wafer 224. In general, a VAIL can permit the beam to pass through. Lens 40 is also a VAIL, since reticle 204 is immersed in the field. It may be referred to either as a "dual" VAIL since it performs two focusing actions—one to focus a collimated beam on to reticle 204 and another to collimate the beam emerging from reticle 204, or it may be referred to as a "transmissive" VAIL, since it transmits the beam to the next element instead of stopping it.

The axis crossover makes possible some advantageous features of the invention. One skilled in the art would think that, having reduced off-axis aberrations with axis-shifting yokes 43 and 45, it would be sufficient to continue beam axis 104 all the way down to wafer 224, with only a minor correction in displacement to stitch together the subfields on the wafer. The addition of any elements invariably introduces aberration, since no element is perfect. Thus, one skilled in the art would prefer to have only a single offset axis and to avoid the use of additional elements such deflectors 66 and 68. The addition of deflectors 66 and 68 and the deflection through the pivot point, however, effectively decouples the two lens systems 40 and 50 from each other, so that each can have its own optical axis independently, with the beam staying on these respective variable axes.

A first advantage of this independence is that the beam can be steered at all times through one fixed pivot point on the symmetry axis 102 of the lens system at a location that can be chosen at will. Thus, there can be a single multi-purpose aperture 70 on the pivot point, instead of one aperture for each subfield. If the beam stayed on the same side of the system axis, an aperture plate containing one opening for each subfield would be required. This would not be practical because extremely stringent requirements for accuracy and stability comparable to those imposed on X-ray masks would have to be placed on such a multi-hole aperture plate under continuous high power electron bombardment. Aperture 70 has several purposes: to limit the image size of source 10 (by clipping the tails of the electron distribution); to block electrons strongly scattered in the reticle; to create image contrast at the target; and to provide a means to sense beam current for alignment and other corrections. Accordingly, it will be sometimes referred to as a multi-purpose aperture.

A second advantage is the ability to place elements for dynamic correction of aberrations (field curvature, astigmatism, distortion) symmetrically around the fixed pivot point, so that additional aberrations resulting from the scanning motion of the beam are minimized because the beam passes through the corrective elements concentrically.

Lens 40 is also referred to as an immersion lens, in analogy to optical lenses, since the object (the reticle) is immersed in the focussing field defining the lens. Immersion is not required, and both the physical location along the Z-axis and the shape of the fields may be tailored. The reticle is not required to be placed exactly on the symmetry plane of lens 40 as shown in FIG. 1. Since the lower part of lens 40, in conjunction with lens 50, provides the overall demagnification of the system, a different axial position of the reticle may be chosen to optimize the overall system performance. For example, the reticle may be placed upstream and outside the field of lens 40, in which case both sections of lens 40 will act as one lens. The embodiments in FIGS. 3A and 3B discussed below illustrate alternatives.

ELECTRICAL AND MECHANICAL SCANNING

The exposure process requires synchronization of 4 independent scanning motions:

1. Electrical beam scan on the reticle
2. Mechanical scan of the reticle
3. Electrical beam scan on the wafer
4. Mechanical scan of the wafer Both electrical scans can be modified to correct for errors of the mechanical scans of reticle and wafer, and also to deliberately deviate from the mechanical scans to minimize overhead times at turn-around points.

Figure 2A:
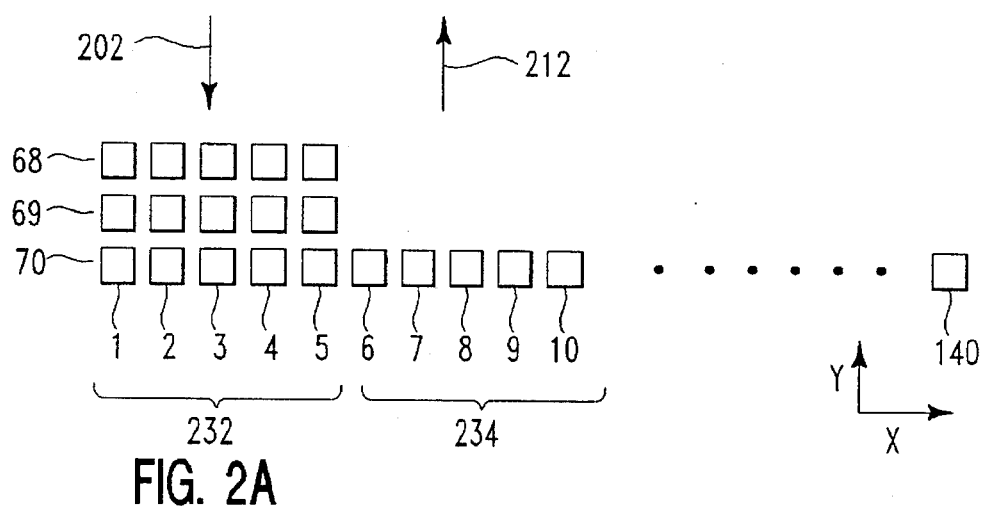
FIGS. 2A and 2B illustrate a top view of a reticle and wafer illustrating the scanning sequence.
Figure 2B:
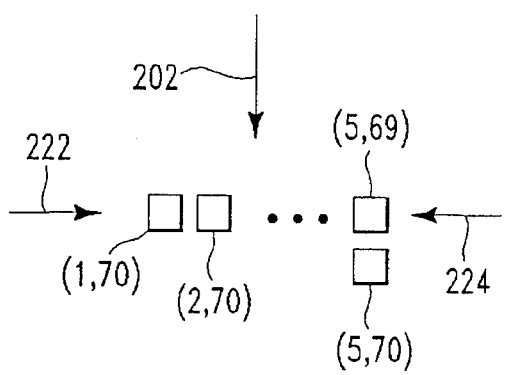

In FIG. 1, beam 104 steps over reticle 204 in the X direction illustratively from right to left in the figure (with beam 106 stepping over wafer 224 simultaneously from left to right), while the reticle and wafer are scanned mechanically in the Y direction (in and out of the paper plane). The mechanical motion is not interrupted for exposures. Blurring of the image due to motion during exposure is avoided by deflecting the beam during the exposure (referred to as bucking the stage motion) to compensate for the stage motion. The scanning operation is illustrated in FIGS. 2A and 2B. FIG. 2A illustrates a top view of a chip having, say, 70 by 140 subfields showing a few (68, 69, 70) and columns. The beam is effectively limited to a small range in the Y dimension, say a few subfield rows, perpendicular to the X–Z plane. There is no need to scan the beam electrically by a large amount in the Y-direction, when a continuously moving stage is used, which accomplishes the result. However, X and Y electrical scanning can be combined with a mechanical "step & repeat" motion in order to employ a deflection system having a smaller deflection than that illustrated here.

For purposes of illustration, an example is shown in which the beam steps electrically in a stripe of five subfields in the X-dimension while simultaneously the reticle and wafer are moved mechanically in the Y dimension. In FIG. 2A, the extent of the X-stepping is indicated by the bracket labelled 232 and the Y-motion is denoted by the arrow labelled 202. Since the wafer (and reticle) is moving in the Y-direction, the beam must electrically sweep in the Y-direction also in order to preserve alignment. This is illustrated in FIG. 2B, showing the location in space of the subfields (1,70) to (5,70) and (5,69). Each subfield is displaced in space along the Y axis in order to preserve alignment on the moving wafer. For example, at the end of the five field sweep, subfield (5,70) is displaced by one row and subfield (5,79) has the same Y-value at the time of exposure as subfield (1,70) had during its exposure. At the end of stripe 232, the mechanical motion will reverse and the beam will travel along stripe 212 of FIG. 2A. Preferably, the beam scanning rate is adjusted during deceleration of the reticle and wafer transports at the end of scan 232 to compensate for the deceleration (and similarly during acceleration at the start of the next scan 212). With such an arrangement, there is a smaller waiting period at the end of a scan than there would be if the beam were off during a deceleration and acceleration period.

Figure 4:
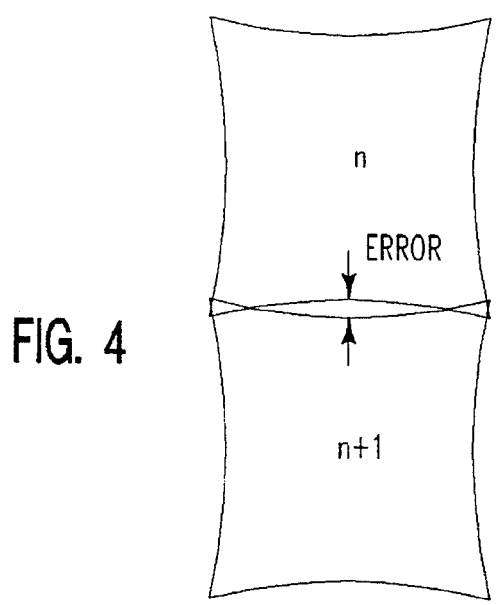
FIG. 4 illustrates an enlarged view of adjacent subfields on the wafer.

Referring now to FIG. 4, there is shown in FIG. 4A an enlarged portion of a wafer showing in exaggerated fashion the intersection of two adjacent subfields, n and n+1. Note that lines perpendicular to the edges of the common boundary will connect at the area in the corners because the subfields overlap there, but such lines will not meet in the center of the boundary. Conversely, lines parallel to the boundary may overlap and short out in the overlap region, while such parallel lines will have an extra margin of separation in the center area. For a nominal alignment error of 20 nm, the subfields should overlap by some distance (illustratively 50 nm) in order to ensure that there are no gaps in connecting lines. Overexposure in the overlap area may be avoided by use of the techniques taught in copending patent application Ser. No. 08/173,315 by D. E. Davis, or by the use of triangular tips of corresponding lines. Complementary triangular tips having the length of the nominal overlap are formed at the ends of the lines at the boundaries of subfields. A compromise angle is 45°, but those skilled in the art will readily be able to select different angles to suit their circumstances.

TYPES OF RETICLES

The inventive system can be used with reticles of differing types, both conventional stencil reticles as illustrated in the Bohlen reference and "conventional" scattering reticles as illustrated in the Berger reference.

In stencil reticles, the beam passes through open apertures and is totally absorbed by the "opaque" portions. In this case, the contrast improvement feature of multi-purpose aperture 70 is not needed and the blocking plate may be dispensed with if the other functions of the plate are not required or can be performed at another location. Stencil reticles and scattering reticles represent two extremes of reticle design. The former suffers from problems associated with the heat load on the reticle. The latter suffers from a substantial loss of current at the contrast aperture even from the "transparent" areas of the reticle.

Figure 5:
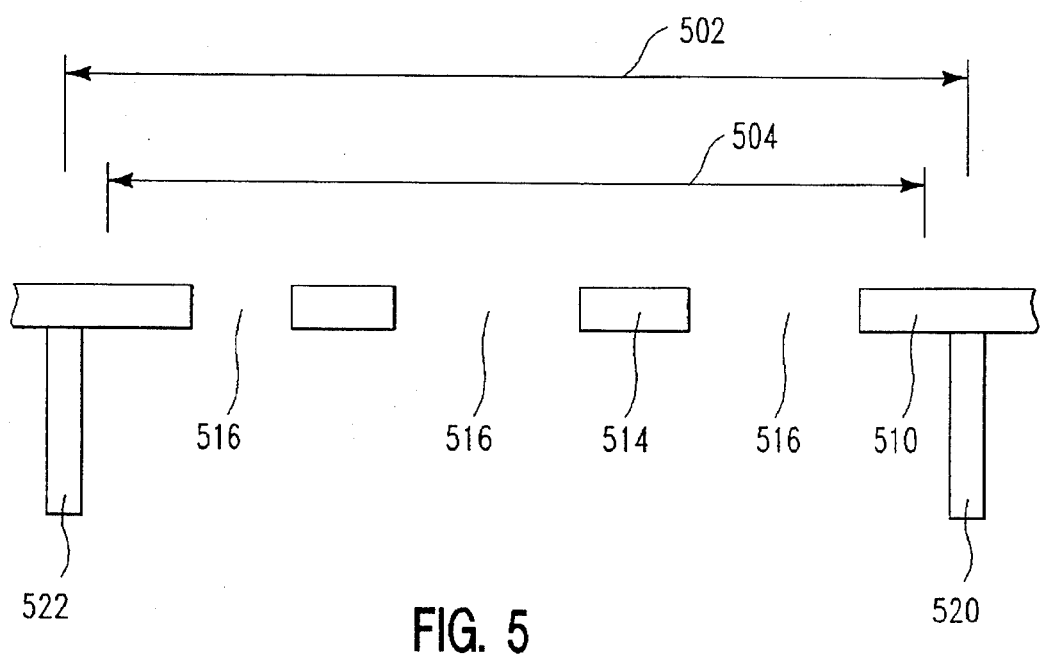
FIG. 5 illustrates a cross section of a reticle suitable for use with the invention.

In FIG. 5, there is illustrated in cross section a reticle of a novel type that may be used with the invention. Layer 510 is the main material of the reticle, illustratively Silicon. The thickness of layer 510 is set such that a substantial number (90%, say) of 100 kev electrons are scattered far enough to be intercepted by the contrast aperture. For Silicon, this thickness is approximately 1.0 µm. Struts 520 and 522 bracket the subfield illustrated. These struts are separated by a nominal distance indicated by the arrow labelled 502. The nominal usable dimension of the subfield is indicated by the arrow labelled 504 and is 1 mm in this example. Struts 520 have a nominal width and thickness of about 0.2 mm. They may be fabricated by conventional etching techniques. Aperture 516, represented here in the more common situation of a singly-connected area, is an opening in layer 510. Such a reticle has the advantage over a "differential" scattering reticle that it will cause less over-all scattering (none in the openings). Consequently, substantially less current is lost at the contrast aperture. There will always be a background intensity on the wafer of electrons that were scattered so close to the forward direction that they pass through aperture 70. The thickness of the blocking areas will be selected to provide efficiency in removing electrons that pass through that area (which increases with increasing reticle thickness) adequate for the contrast of the resist process used, such that the fraction of electrons passing through the blocking area and the aperture do not cause appreciable resist exposure.

CALIBRATION AND ERROR CORRECTION

An advantageous feature of the present invention, combining as it does features of a probe-forming system with the projection technique, is that each subfield can be dynamically corrected for lens aberrations, thermal distortions, errors in the mechanical transport, etc. A system will initially be calibrated both in the aberrations for each subfield and also for the thermal effects from heat deposited by the beam in the course of operation. As the system handles each subfield, correction factors can be applied to the lenses, deflectors, and other corrective elements (quadrupoles, hexapoles, octupoles, etc.). In addition, the system may be used in closed loop fashion by directing a pulse of electrons at a dummy subfield at the periphery of the chip containing a pattern for calibration to be matched up with corresponding registration marks on the wafer. The accuracy of registration is checked by detecting electrons scattered from the registration marks and appropriate corrections are applied to the deflectors and/or other corrective elements.

ALTERNATIVE EMBODIMENTS

Figure 3A:
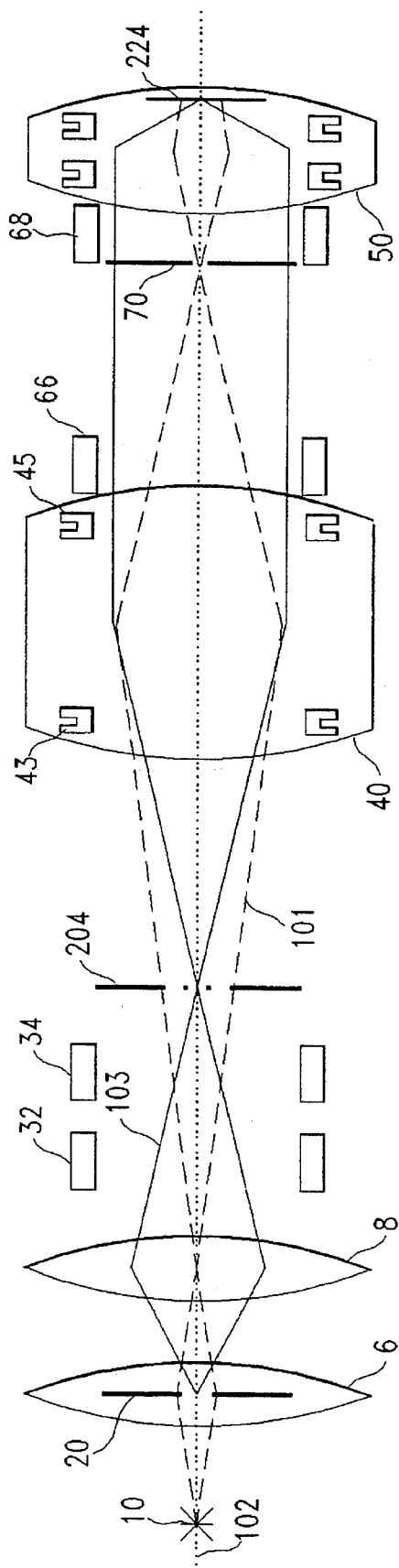
FIGS. 3A–3C illustrate a variety of embodiments distinguished by the number and arrangement of optical elements and corresponding beam tracings.
Figure 3C:
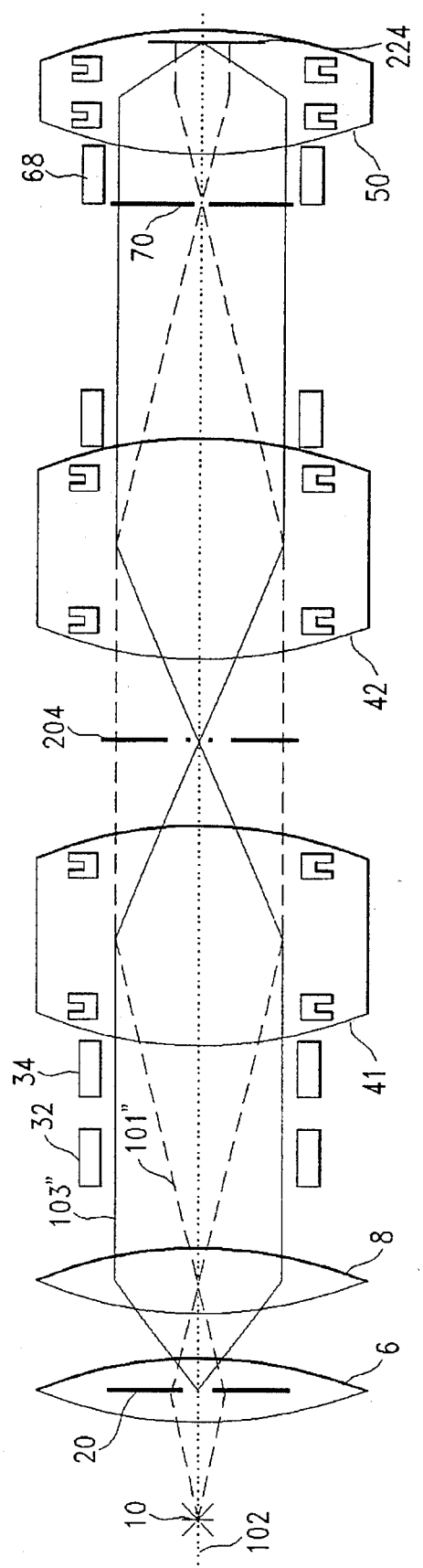
Figure 3B:
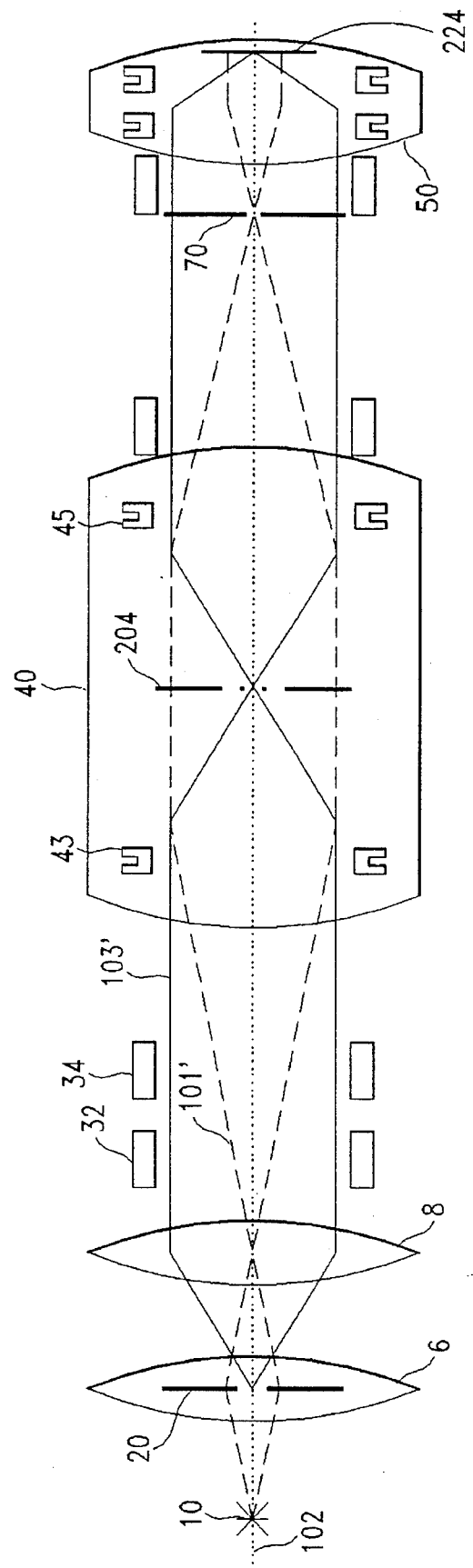

Referring now to FIGS. 3A, 3B and 3C, three alternative embodiments are shown. The solid lines denoted 103,103' and 103" represent the object (illumination aperture 20 as well as reticle 204) imaging ray tracing and the dashed lines denoted 101, 101' and 101") represent the imaging ray tracing of source 10. The axis shifts are not illustrated in the drawing in order to improve the clarity of presentation.

Images of objects (illumination aperture and reticle) and source occur where the respective lines converge. In FIG. 3A, lens 6 forms an intermediate image of source 10 at a position suitable for lens 40 to form another image on aperture 70. This is optional and provides more efficient use of the electrons from the source at the cost of imposing additional constraints on the position and focal length of the elements. When this option is used, the illuminating aperture and the source are not conjugate. Lens 8 forms an image of illumination aperture 20 on reticle 204, which has been moved upstream from its position in the embodiment of FIG. 1 so that it is out of the field of VAL lens 40. This shift eliminates any problems with eddy currents caused by motion of the reticle and/or the support. It also provides a less constrained physical environment for the reticle and its stage, which may be very important in view of the need to move the stage quickly in order to obtain the greatest throughput. Furthermore, the magnetic environment of the reticle must be carefully tailored to minimize aberrations; this would not be possible if the reticle were exposed to the lens field, the amplitude of which is determined by the focusing condition and therefore fixed. The function of VAL lens 40 is now to form an image of source 10 on aperture 70, as before and also, together with VAIL lens 50 to form an image of reticle 204 on wafer 224. It is therefore referred to as a collimator/condenser lens since it collimates the rays in beam 103 and also condenses the rays in beam 101 to form the image of the source on aperture 70. In the space between elements 66 and 68 beam 103 is represented by parallel lines and beam 101 is represented by converging lines. This symbolic representation refers to the images, not to the distribution in space of the electrons. Since the beam is about the size of a subfield, it will not fill the space within the yoke inner diameters, as might be inferred if FIG. 3a were a pictorial representation. The phrase "collimating the electron beam from an object" and variations thereof means in analogy to optical terminology that the image plane of the object is at infinity. Between elements 66 and 68, the image plane of the nth subfield is at infinity and the image plane of source 10 is at a finite distance (the plane of aperture 70). The fact that beam 103 is shown as parallel lines does not mean that all the electrons are travelling parallel to axis 102. VAL 40 is shown schematically, with axis-shifting yokes 43 and 45 indicated. The main coil and the pole pieces are represented symbolically by the curved lines enclosing the yokes, similar to the representation of an optical lens.

In FIG. 3B, lens 6 functions as before, while lens 8 collimates rays from illumination aperture 20. The left side of lens 40 forms an image of aperture 20 on reticle 204, as lens 8 did in the embodiment of FIG. 3A, and also collimates beam 101. The right side of the lens forms an image of source 10 on aperture 70 and also collimates the rays from reticle 204. This lens is referred to as a "dual" VAIL since the lens is operating in a dual focusing telocentric mode in which there are two focal planes at different positions along the z-axis. The "focal length" of the left and right portions need not be the same and the reticle need not be located at the midpoint of lens 40.

The magnetic field in lens 40 is strong enough to generate an image of aperture 20 at the position of reticle 204 and simultaneously is imaging source 10 into aperture 70. The reticle then is located at the peak of the lens field.

FIG. 3C shows a VAL doublet ("dual VAL") with a focus between the two lenses 41 and 42. This doublet is not necessarily a symmetric one and an asymmetric configuration may be more convenient when it is desired to adjust the position of the focal planes as part of an engineering tradeoff. The polarity of lenses 41 and 42 can be opposed to generate a field free region in the vicinity of reticle 204. Since the electrons spiral about the field lines, an image will be rotated by an amount that depends on the field strength and distance along the Z-axis to the image plane. The integral over the axial components of all fields between the reticle and the wafer should be zero in order to cancel out the rotation of the subfield image with respect to the reticle subfield. Some deviation from zero may be tolerated, of course, depending on the error budget of the system.

In order to line up the subfield edges with the scan direction of stages and beam deflection, an image rotation of an integral multiple of 90 degrees is also acceptable. A second requirement, which is met by the use of a VAIL, is that the beam landing at the target be normal to the target. A third requirement is the compensation/minimization of aberrations in the imaging ray tracing. To accomplish this the magnetic field at the reticle has to be adjusted for optimum illumination.

The advantage of the configurations shown in FIGS. 3B and 3C over that shown in FIG. 3A is tighter control of the image of aperture 20 and therefore better illumination of the reticle over the entire beam scan area. The advantage of 3C over 3B is the tailoring of the magnetic field at the reticle. Configuration 3B, however, would be less complex than 3C (it has fewer yokes). Which of these embodiments, or any further ones derived from them, eventually will be the preferred one, depends on the usual engineering tradeoffs among overall system configuration, operation and performance requirements.

CORRECTION ELEMENTS

Correction elements are required to correct for astigmatism, distortion of the undeflected subfield (that on axis 102), for field curvature, and for potential distortion changes of the deflected subfields (those off axis 102). Furthermore, compensation of space charge defocusing may be performed in real time. This compensation varies with the pattern-dependent average transparency of the subfields. It is an advantage of this invention that a different correction can be applied for each subfield. Initial calibration will generate a set of correction data that may be stored in storage unit 110 in FIG. 1. This unit may be a disk drive, random access memory or any other convenient form of storage. Controller 100, which may be a general purpose computer such a PS/2® system from IBM, selects the appropriate correction factors and applies them to correction elements indicated schematically by the box labelled 80 in FIG. 1. Pre-exposure calibration of the space-charge defocusing (by reliable mapping) is an alternative to than real-time correction for each subfield based on current measurement at the aperture at the beginning of each subfield exposure period. Conventional correction elements such as the "stigmators" described in electron optical textbooks and comprising at least a pair of quadrupole lenses are used to correct for astigmatism. Higher order multipoles such as hexapoles may also be employed to correct for subfield distortion. A conventional magnetic lens is used to correct for field curvature. Preferably, the correction elements are located in the plane of an image of the source between reticle and wafer, coincident with the location of multi-purpose aperture 70.

Real-time correction for beam defocus caused by space charge is applied as follows. Plate 72 containing multi-purpose aperture 70 is designed as a sensor plate to measure the intercepted beam current. This current varies inverse proportionally to the reticle transparency and provides a measure for the beam current of each subfield at the wafer. Due to space charge repulsion within the electron beam, a subfield defocusing occurs at the wafer as a function of the wafer beam current passing through the reticle subfield. This defocusing can be compensated by a dynamic focus lens (magnetic or electrostatic) which is driven according to beam current measurements around multi-purpose aperture 70. This measurement can be carried out with a real time focus servo which corrects for space charge defocusing during a short initial period of the subfield exposure (approximately 1% of subfield exposure time) without causing noticeable blurring of the exposed image. The size of aperture 70 is set to accomplish the various purposes it serves as described above and the expansion of the beam at the aperture from space charge effects is very small, so that direct measurement of the effect of space charge is not practical. Instead, the scattered beam is used as a discriminant, using to advantage the inverse relationship between scattered beam current and space charge.

Figure 6:
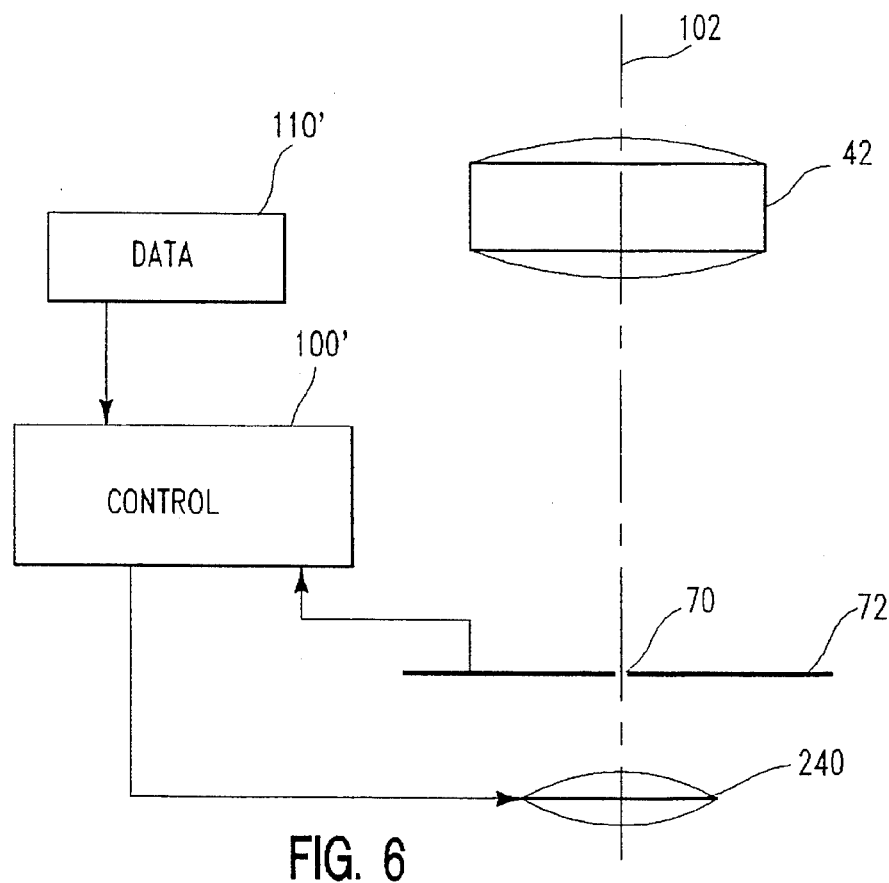
FIG. 6 illustrates a portion of an embodiment of the invention having dynamic focus correction for space charge correction.

In operation, referring to FIG. 6, a detector located within controller 100' (a portion of controller 100 of FIG. 1) senses scattered beam current during the initial period (1 μsec, say) of an electron pulse. Controller unit 100' has previously received from data bank 110' a set of stored reference numbers representing data from sensor plate 72 that are associated with corresponding beam focus adjustment currents for correction lens 240. A comparison is made between the measured data and the stored data in any convenient fashion well known to those skilled in the art (serial comparison in a general purpose computer, parallel comparison in dedicated circuits, etc.). The appropriate correction is then applied to correction lens 240, illustratively positioned downstream (below) plate 72 or in any other convenient location. This is an "open loop" correction and the effect of the correction is not monitored. The current sensing function of aperture 70 can also be exploited in combination with closed loop beam alignment servos which center the electron beam at various apertures as described in U.S. Pat. Nos. 3,894,271, 4,000,440 and 4,423,305.

RETICLE PRE-DISTORTION

To compensate for deflection distortions of the system, the pattern of the reticle could, if desired, be laid down pre-distorted in the opposite direction, provided of course, that the system distortions are known and invariant. For example, in the case of residual barrel distortion in the optical system, the reticle would be pin-cushion shaped in the proper amount varying from subfield to subfield. However, no severe constraints would have to be placed on the allowable distortion regarding symmetry or polynomial order. Even non-linear distortions within a sub-field could thus be dealt with. Repetitive thermal distortion of the mask under beam irradiation can be corrected as well as reducing the requirements for global thermal distortion.

Those skilled in the art will readily be able to devise other embodiments of the invention than that illustrated and the scope of the following claims is not meant to be limited to the embodiments shown.

We claim:
1. An E-beam system for writing a pattern on a wafer comprising:

an electron source and means for accelerating an electron beam (10) along a system axis (102) and through an illuminating aperture (20);

first magnetic focus means, having a first focal length, (8) disposed along said system axis, having a first magnetic symmetry axis, and intercepting said electron beam for operating on said electron beam emerging from said illuminating aperture;

first and second deflection means (32, 34) disposed along said system axis between said first magnetic focus means and said reticle for displacing said electron beam so that said electron beam travels along a reticle axis (104) parallel to said system axis and intersecting an nth reticle subfield;

a first section of a second magnetic focus means (40), having a second focal length, and disposed along said system axis between said first magnetic focus means and a reticle, having a second magnetic symmetry axis, and intercepting said electron beam, said first magnetic focus means and said first section of said second focus means cooperating to focus said displaced electron beam to form an image of said illuminating aperture on a reticle (204), said image of said illuminating aperture covering said nth reticle subfield of a plurality of N noncontiguous reticle subfields of said reticle that are separated from one another by a subfield separation distance, said nth subfield intercepting said reticle axis and containing at least $10^4$ pixels, whereby all of said pixels of said nth subfield are exposed to said beam simultaneously, a second section of said second magnetic focus means disposed along said system axis between said reticle and said wafer for operating on said electron beam from said subfield;

third deflection means (66) disposed along said system axis and intercepting said electron beam from said third focus means travelling along said reticle axis for deflecting said electron beam back toward said system axis and through a pivot point on said system axis;

fourth deflection means (68) disposed along said system axis and intercepting said electron beam for deflecting said electron beam from said third deflection means to a wafer axis (106) parallel to said system axis and on the opposite side of said system axis from said reticle axis;

third magnetic focus means (52) disposed along said system axis, having a third magnetic symmetry axis and intercepting said electron beam from said fourth deflection means, said third magnetic focus means cooperating with said second section of said second magnetic focus means to focus an image of said reticle subfield carried by said electron beam on a corresponding nth wafer subfield of a plurality of N contiguous wafer subfields on a wafer (224); each of said second and third magnetic focus means including magnetic axis-shifting means (43, 45, 53) for controllably translating magnetic fields of said magnetic focus means such that said magnetic fields are substantially parallel to and azimuthally symmetric about said reticle axis and said wafer axis, respectively, whereby said second magnetic symmetry axis is coincident with said reticle axis and said third magnetic symmetry axis is coincident with said wafer axis; and a controller connected to said source, said second magnetic focus means, and said third magnetic focus means for controlling the electron beam duration, said first, second, third, and fourth beam deflection means and said magnetic fields of said second and third magnetic focus means and said magnetic axis-shifting means.

2. A system according to claim 1, in which an aperture is positioned on said system axis in a blocking plate disposed such that said pivot point is within said aperture, whereby off-axis electrons are preferentially blocked by said blocking plate.

3. A system according to claim 2, in which at least one correction element is disposed about said pivot point.

4. A system according to claim 3, in which said at least one correction element includes at least two quadrupole and one hexapole electromagnets.

5. A system according to claim 1, in which an aperture is positioned on said system axis in a blocking plate disposed in a source image plane of said system, in which said source and said illuminating aperture are not conjugate, and in which said aperture in said blocking plate is coincident with an entrance pupil of the reticle imaging system.

6. A system according to claim 5, in which at least one correction element is disposed about said pivot point.

7. A system according to claim 6, in which said at least one correction element includes at least two quadrupole electromagnets and one hexapole electromagnet.

8. A system according to claim 1, in which at least one correction element is disposed about said pivot point.

9. A system according to claim 8, in which said at least one correction element includes at least two quadrupole and one hexapole electromagnets.

10. A system according to claim 1, in which said second and third magnetic focus means combine to generate axial magnetic field components parallel to said system axis having magnitudes and polarities such that the integral of said axial magnetic field components along a beam path between said reticle and said wafer is substantially zero.

11. A system according to claim 10, in which an aperture is positioned on said system axis in a blocking plate disposed such that said pivot point is within said aperture, whereby off-axis electrons are preferentially blocked by said blocking plate.

12. A system according to claim 11, in which at least one correction element is disposed about said pivot point.

13. A system according to claim 12, in which said at least one correction element includes at least two quadrupole electromagnets and one hexapole electromagnet.

14. A system according to claim 1, in which an aperture is positioned on said system axis in a blocking plate disposed along said system axis between said reticle and said wafer and in which at least one detector is disposed about said aperture, further including signal comparison means responsive to the amount of charge striking said at least one detector during an initial period of a beam pulse for transmitting a correction signal dependent on said amount of charge to beam correction means disposed along said system axis for altering said beam in response to said correction signal.

15. A system according to claim 14, in which said at least one detector comprises said blocking plate and said beam correction means comprises beam focus correction means responsive to said correction signal.

16. A system according to claim 15, in which said beam focus correction means is located between said aperture and said wafer.

17. A system according to claim 14, in which said blocking plate is disposed in a plane that is not an image plane of said reticle subfield.

18. A system according to claim 15, in which said blocking plate is disposed in a plane that is not an image plane of said reticle subfield.

19. A system according to claim 1, in which an aperture is positioned on said system axis in a blocking plate disposed along said system axis between said reticle and said wafer and in which at least one detector is disposed about said aperture, further including signal comparison means responsive to the amount of charge striking said at least one detector during an initial period of a beam pulse for transmitting a correction signal dependent on said amount of charge to beam correction means disposed along said system axis for altering said beam in response to said correction signal.

20. A system according to claim 19, in which said at least one detector comprises said blocking plate and said beam correction means comprises beam focus correction means responsive to said correction signal.

21. A system according to claim 19, in which said beam focus correction means is displaced along said system axis from said reticle at least as far as the position of said aperture.

22. A system according to claim 19, in which said blocking plate is disposed in a plane that is not an image plane of said reticle subfield.

23. A system according to claim 24, in which said blocking plate is disposed in a plane that is not an image plane of said reticle subfield.

* * * * *